(12) United States Patent
Konishi

(10) Patent No.: US 7,846,547 B2
(45) Date of Patent: Dec. 7, 2010

(54) INSULATION-COATED CONDUCTIVE PARTICLE

(75) Inventor: Misao Konishi, Tochigi (JP)

(73) Assignees: Sony Corporation, Tokyo (JP); Sony Chemical & Information Device Corporation, Tokyo (JP)

( * ) Notice: Subject to any disclaimer, the term of this patent is extended or adjusted under 35 U.S.C. 154(b) by 175 days.

(21) Appl. No.: 10/565,477

(22) PCT Filed: Jun. 9, 2004

(86) PCT No.: PCT/JP2004/008024

§ 371 (c)(1),
(2), (4) Date: Jan. 20, 2006

(87) PCT Pub. No.: WO2005/017923

PCT Pub. Date: Feb. 24, 2005

(65) Prior Publication Data

US 2006/0261315 A1 Nov. 23, 2006

(30) Foreign Application Priority Data

Aug. 19, 2003 (JP) ............................. 2003-295666

(51) Int. Cl.
*B32B 5/16* (2006.01)
(52) U.S. Cl. .................. 428/407; 428/403; 252/500
(58) Field of Classification Search ............... 252/500; 428/328, 403, 407
See application file for complete search history.

(56) References Cited

U.S. PATENT DOCUMENTS

| | | | | |
|---|---|---|---|---|
| 3,985,920 | A * | 10/1976 | Travis | 427/208.2 |
| 5,466,567 | A * | 11/1995 | Anderson et al. | 430/530 |
| 5,965,064 | A * | 10/1999 | Yamada et al. | 252/512 |
| 2002/0032250 | A1* | 3/2002 | Okazaki et al. | 522/83 |
| 2003/0203991 | A1* | 10/2003 | Schottman et al. | 523/334 |
| 2004/0109995 | A1* | 6/2004 | Wakiya et al. | 428/328 |

FOREIGN PATENT DOCUMENTS

| | | |
|---|---|---|
| DE | 100 16 041 A1 | 10/2001 |
| EP | 0 996 321 A2 | 4/2000 |
| JP | 59-189103 | 10/1984 |
| JP | 5-059338 | 3/1993 |
| JP | 05-070750 | 3/1993 |
| JP | 05-217617 | 8/1993 |
| JP | 8-302321 | 11/1996 |
| JP | 08-325543 | 12/1996 |
| JP | 09-030112 | 2/1997 |
| JP | 11-241054 | 9/1999 |
| JP | 2000-169800 | 6/2000 |
| JP | 2003-142156 | 5/2003 |
| JP | 2003-529647 | 10/2003 |
| JP | 03529647 | 10/2008 |
| WO | 01/74913 A1 | 10/2001 |

OTHER PUBLICATIONS

Encyclopedia of Chemical Technology, vol. 13, pp. 142 to 166 (1984).
Motohide Takechi, "Iho Dodensei Film Ni Yoru Flip Chip Jisso Gijutsu," Denshi Zairyo, 2001 Nen 5 Gtasugo Bessatsu, pp. 130-133.

* cited by examiner

*Primary Examiner*—Mark Kopec
*Assistant Examiner*—Tri V Nguyen
(74) *Attorney, Agent, or Firm*—K&L Gates LLP

(57) ABSTRACT

To provide both an excellent solvent-resistance and a conduction reliability to an insulation coated conductive particle that is suitable for use as a conductive particle in an anisotropic conductive adhesive, the insulation coated conductive particle is configured such that the surface of a conductive particle is coated with an insulating resin layer formed of an insulating resin having a carboxyl group, and the insulating resin layer is surface-treated with a polyfunctional aziridine compound. Examples of the aziridine compound include trimethylolpropane-tri-β-aziridinylpropionate, tetramethylolmethane-tri-β-aziridinylpropionate, and N,N-hexamethylene-1, 6-bis-1-aziridinecarboxamide. The insulating resin layer is preferably composed of an insulating resin having an acrylic acid monomer unit or a methacrylic acid monomer unit. Specifically, the preferable insulating resin is an acrylic acid-styrene copolymer.

18 Claims, No Drawings

INSULATION-COATED CONDUCTIVE PARTICLE

CROSS REFERENCE TO RELATED APPLICATIONS

The present application claims priority to Japanese Patent Document No. 2003-295666 filed on Aug. 19, 2003, the disclosure of which is herein incorporated by reference.

The present invention relates to an insulation coated conductive particle used in an anisotropic conductive adhesive.

Insulation coated conductive particles, formed by coating the surface of conductive particles with a thermoplastic insulating resin, are widely used in anisotropic conductive adhesives. In such uses, the coating is used to prevent occurrence of short circuits between the conductive particles. Examples of conductive particles include metal particles such as nickel particles, and metal plated particles each having a metal plating layer formed on the surface of a resin particle.

Patent Document 1: Japanese Patent Application Laid-Open No. Hei 5-217617
Patent Document 2: Japanese Patent Application Laid-Open No. Hei 5-70750

However, when a film or a paste of the anisotropic conductive adhesive is manufactured using the aforementioned insulation coated conductive particles, the insulating resin layer that coats the conductive particles swells, dissolves, or is deformed in the solvents sometimes used in the manufacturing process. In those cases, a conduction reliability of the anisotropic conductive adhesive is adversely affected.

In order to improve a solvent resistance of the insulating resin layer, the insulating resin layer is considered to be formed from a thermosetting insulating resin composition. However, when the insulating resin layer is too hard, it is not possible to remove sufficiently the insulating resin layer from a region between opposed electrodes that are to be connected to each other. Thus, the required conduction between the electrodes cannot be reliably obtained.

SUMMARY

It is an object of the present invention to provide insulation coated conductive particle exhibiting excellent solvent resistance as well as providing reliable conduction properties, when used in an anisotropic conductive adhesive.

The inventor of the present invention found that it was possible to improve the solvent-resistance and conduction reliability of insulation coated conductive particles when an insulating resin having a carboxyl group was formed as an insulating resin layer on the surface of a conductive particle, and then the insulating resin layer was subjected to a surface treatment by a polyfunctional aziridine compound having two or more aziridine groups such that there was reaction between the carboxyl and aziridine groups. Based on this, the inventor arrived at the present invention.

That is, the present invention provides in an embodiment an insulation coated conductive particle in which the surface of a conductive, particle is coated with an insulating resin layer formed of an insulating resin having a carboxyl group, wherein the insulating resin layer is surface-treated with a polyfunctional aziridine compound.

Moreover, the present invention provides in an embodiment a method for fabricating an insulation coated conductive particle, which method includes the step of performing a surface treatment with a polyfunctional aziridine compound on an insulating resin layer that is formed of an insulating resin having a carboxyl group, and coats the surface of a conductive particle.

Furthermore, the present invention provides in an embodiment an anisotropic conductive adhesive in which the aforementioned insulation coated conductive particles are dispersed in an insulating adhesive.

According to the present invention, it is possible to provide both an excellent solvent-resistance and a conduction reliability to an insulation coated conductive particle that is suitable for use as a conductive particle in an anisotropic conductive adhesive.

Additional features and advantages of the present invention are described in, and will be apparent from, the following Detailed Description.

DETAILED DESCRIPTION

An insulation coated conductive particle of the present invention is formed by coating the surface of a conductive particle with an insulating resin layer.

In the present invention, an insulating resin having a carboxyl group is used as the resin for the insulating resin layer that coats the conductive particle. Thus, adhesion between the conductive particle and the insulating resin layer can be improved. An example of the insulating resin having a carboxyl group is an insulating resin having a monomer having a carboxyl group—preferably an acrylic acid monomer unit or a methacrylic acid monomer unit. Specific examples include acrylic acid-styrene copolymer (PP-2000S, Dainippon Ink and Chemicals Inc., acid number 5 mgKOH/g or less), carboxylic acid modified styrene-divinylbenzene copolymer (SX8742A manufactured by JSR Corporation, an acid value of about 3.5 mgKOH/g), and other copolymers.

When the carboxyl amount (acid value) in the insulating resin is too small, the solvent resistance is insufficient. On the other hand, when the carboxyl amount in the insulating resin is too large, the cross-linking density is excessively high and therefore conduction reliability is impaired. Thus, the carboxyl amount in the insulating resin is preferably in the range from 0.1 to 50 mgKOH/g, and more preferably in the range from 0.5 to 5 mgKOH/g.

The thickness of the insulating resin layer is preferably in the range from 0.01 to 1 μm, and more preferably, in the range from 0.1 to 0.5 μm. This is because insulation provided by the insulating resin layer is insufficient when the layer is too thin, and the conduction properties thereof are low when the layer is too thick.

As described above, in the insulation coated conductive particle of the present invention, the surface of the conductive particle is coated with an insulating resin layer formed of an insulating resin having a carboxyl group. Thus, in order to ensure a sufficient conduction reliability in the resulting anisotropic conductive adhesive, the insulating resin layer of the insulation coated conductive particle should be removed from a region between portions to be connected during thermal compression bonding. Therefore, the insulating resin layer should be thermoplastic under the conditions of a thermal treatment. However, the thermoplastic insulating resin can easily swell in organic solvents and may be dissolved by organic solvents in some cases. Thus, such a thermoplastic insulating resin has a problem of the solvent-resistance. Moreover, a carboxyl group can easily react with the epoxy group of an epoxy resin, these being generally used as an adhesive component of anisotropic conductive adhesives. Thus, the carboxyl group may reduce the storage stability of anisotropic conductive adhesives.

Therefore, in the present invention, the insulating resin layer of the insulation coated conductive particle is surface-treated with a polyfunctional aziridine compound having two or more aziridine groups. This surface treatment is performed to cause reaction between the aziridine groups of the polyfunctional aziridine compound and the carboxyl groups of the insulating resin. More specifically, a solution (e.g., an ethanol solution) of the polyfunctional aziridine compound is typically sprayed onto the surface of the insulating resin layer and is then heated and dried at a temperature from 80° C. to 140° C. Thus, reaction between the aziridine groups and the carboxyl groups is effected. Alternatively, this reaction may be effected by adding conductive particles coated with the insulating resin into a solution (e.g., an ethanol solution) of the polyfunctional aziridine compound, dispersing those conductive particles while stirring the mixture, and then stirring and heating the mixture at a temperature from 30° C. to 80° in that state. As a result, the surface of the insulating resin layer is cross-linked by the aziridine compound. Therefore, the solvent resistance of the insulation coated conductive particle can be improved without damaging a thermoplastic property of the insulating resin layer. Moreover, free carboxyl groups can be eliminated. Thus, the storage stability of an anisotropic conductive adhesive can be improved even if epoxy resin is used as the adhesive component.

Please note that the reaction between the aziridine group and the carboxyl group is widely known (see Encyclopedia of Chemical Technology, vol. 13, pp. 142 to 166 (1984), for example).

It is preferable that the number of aziridine groups in the polyfunctional aziridine compound be at least two from a viewpoint of providing cross-linking. Specific examples of the polyfunctional aziridine compound include trimethylolpropane-tri-β-aziridinylpropionate, tetramethylolmethane-tri-β-aziridinylpropionate, and N,N-hexamethylene-1, 6-bis-1-aziridinecarboxamide. Trimethylolpropane-tri-β-aziridinylpropionate is more preferable from a viewpoint of reactivity.

The amount of polyfunctional aziridine compound to be used is appropriately determined in accordance with the number of aziridine groups in the aziridine compound, the carboxyl equivalent of the insulating resin, the required level of the solvent-resistance, and the like.

A conductive particle having the same structure as that used in conventional anisotropic conductive adhesives can be used as the conductive particle in the insulation coated conductive particle of the present invention. Examples of such a conductive particle include a solder particle, a nickel particle, a resin particle plated with a metal (e.g., nickel, gold, or the like), and a particle formed by coating any of those particles with an insulating material. Among the above particles, a resin particle plated with nickel and gold and which exhibits good conduction reliability may be preferably used.

When the average particle diameter of the conductive particles used in the present invention is too small, the conduction reliability may deteriorate. On the other hand, when the average particle diameter is too large, insulating properties may be insufficient. Therefore, it is preferable that the average particle diameter be in the range from 2 to 10 μm.

The insulation coated conductive particle of the present invention can be fabricated by arranging a polyfunctional aziridine compound on the surface of an insulating resin layer, formed of an insulating resin having a carboxyl group, which coats a conductive particle, and then heating the polyfunctional aziridine compound and the insulating resin layer to cause reaction between the carboxyl group of the insulating resin and the aziridine group of the aziridine compound. More specifically, the surface of the conductive particle is coated with an insulating resin in a usual manner. Then, a solution (e.g., ethanol solution) of a polyfunctional aziridine compound is sprayed onto the surface of the insulating resin and is dried and heated at a temperature from 80° C. to 140° C. In this manner, the reaction between the carboxyl group and the aziridine group can be effected. Alternatively, the above reaction may be effected by adding the conductive particles coated with the insulating resin to the solution of a polyfunctional aziridine compound and then heating the mixture at a temperature from 30° C. to 80° C. while stirring. In this case, the surface-treated particles may be filtered after reaction.

The insulating conductive particle of the present invention can be preferably used as a conductive particle in an anisotropic conductive adhesive. Such an anisotropic conductive adhesive can be manufactured by uniformly mixing the insulation coated conductive particles with an insulating adhesive, serving as an adhesive component, in the usual manner, together with an organic solvent or inorganic filler if necessary. This anisotropic conductive adhesive can be formed to be a paste or a film in the usual manner.

When the amount of the insulation coated conductive particles blended in the anisotropic conductive adhesive is too small, the conduction reliability may deteriorate. On the other hand, when the blended amount of the insulation coated conductive particles is too large, the insulating properties may be insufficient. Therefore, it is preferable that the blended amount of the insulation coated conductive particles be in the range from 1 to 20 vol%.

Known insulating adhesives can be used as the insulating adhesive to be used in the above anisotropic conductive adhesive. Examples of the insulating adhesive include: thermosetting liquid insulating adhesives comprising a polymerizable component such as liquid epoxy resin and a curing component such as an imidazole-based curing agent or a modified amine-based curing agent; liquid insulating adhesives comprising acrylate-based resins having a polymerizable double bond in conjunction with a curing catalyst; and liquid rubber-based adhesives comprising a thermoplastic resin such as acrylic resin, a rubber-based resin such as SBR, SIS, and polyurethane, and the like. Especially, even in a case where an insulating resin having a carboxyl group is used as the insulating resin of the insulation coated conductive particle, and epoxy resin is used as the insulating adhesive, the storage stability is good because a region of the insulating resin in the vicinity of its surface is cross-linked by the polyfunctional aziridine compound.

Various additives such as a thickener and a surface active agent may be added to the anisotropic conductive adhesive, if necessary.

The insulation coated conductive particle of the present invention can be preferably used when various electronic parts are bonded to a wiring board.

EXAMPLES

The present invention is more specifically described below, based on several examples.

Comparative Example 1

The insulation coated conductive particle of Comparative Example 1 was obtained by coating the surface of a conductive particle (AU204, Sekisui Chemical Co., Ltd.)—in which an Ni-AU electroless plating layer was formed on the surface of a styrene-based resin particle having a diameter of 4

μm—with a styrene-acrylic acid copolymer (PP-2000S, Dainippon Ink and Chemicals Inc.), having a thickness of 0.2 μm, in the usual manner.

Example 1

A solution obtained by dissolving 5 parts by weight of trimethylolpropane-tri-β-aziridinylpropionate (TAZM) in 95 parts by weight of ethanol was evenly sprayed onto the insulation coated conductive particle of Comparative Example 1, and was then heated and dried at a temperature of 100° C. so as to cause cross-linking reaction. In this manner, the insulation coated conductive particle of Example 1 was obtained.

Example 2

100 parts by weight of the insulation coated conductive particles obtained in Comparative Example 1 were dispersed in 100 parts by weight of ethanol. 2 parts by weight of trimethylolpropane-tri-β-aziridinylpropionate (TAZM) was added to the above dispersion liquid and was dispersed by stirring the liquid. Then, the dispersion liquid was heated and stirred at a temperature of 65° C. for 4 hours so as to cause cross-linking reaction. The dispersion liquid after cross-linking was filtered and was then dried at a temperature of 80° C. for 30 minutes. In this manner, the insulation coated conductive particle of Example 2 was obtained.

Example 3

The insulation coated conductive particle of Example 3 was obtained in the same manner as that in Example 2, except that trimethylolpropane-tri-β-aziridinylpropionate (TAZM) was replaced with tetramethylolmethane-tri-β-aziridinylpropionate (TAZO).

Example 4

The insulation coated conductive particle of Example 4 was obtained in the same manner as that in Example 2, except that trimethylolpropane-tri-β-aziridinylpropionate (TAZM) was replaced with N,N-hexamethylene-1,6-bis-1-aziridinecarboxamide (HDU).

Evaluation 10 parts by weight of the insulation coated conductive particles of each of Comparative Example 1 and Examples 1 to 4 were individually put into 90 wt% of three types of solution, i.e., toluene, MEK, and ethyl acetate. Then the thus obtained mixture was left at a room temperature for 100 hours so as to allow the insulation coated conductive particles to settle out. Next, supernatant liquid was separated. The thus obtained supernatant liquid was heated to remove volatile components and thereafter weight of non-volatile components was measured. The weight of the non-volatile components corresponds to the weight of the insulating resin dissolved in the solvent. Table 1 shows the ratio (wt%) of the portion of insulating resin that was dissolved in the solvent compared to the entire amount of insulating resin.

Moreover, the insulation coated conductive particles that settled out were dried. The thus dried insulation coated conductive particles were placed between a pair of copper electrodes (φ6 mm×125 μm) and a voltage was applied across the electrodes. The voltage at which leak occurred (withstand voltage) was measured. The measurement results are shown in Table 1.

In addition, an adhesive composition containing 35 parts by weight of phenoxy resin (YP50, Tohto Kasei Co., Ltd.); 30 parts by weight of epoxy resin (YL980, Japan Epoxy Resins Co., Ltd.; equivalent weight of epoxy: 185 g/eq); 35 parts by weight of imidazole-based curing agent containing epoxy resin dispersed therein (HX3941HP, Asahi Kasei Corporation); 20 parts by weight of conductive particles (conductive particles of any of Examples 1 to 4 and Comparative Example 1); 40 parts by weight of toluene; and 40 parts by weight of ethyl acetate was applied onto a polyethylene terephthalate film for which a peeling treatment was performed so as to have a thickness of 25 μm in the dry state. Then, the adhesive composition was dried at a temperature of 80° C. for 5 minutes to form an adhesive layer. In this manner, an adhesive sheet was formed. Subsequently, an insulating TEG for evaluating a short circuit (chip size: 25×2.5 mm; the number of bumps: 8376; bump size: 35×55 μm; space between bumps: 10 μm) that included an ITO wiring arrangement arranged in the form of the teeth of a comb on a glass substrate, was pressure-bonded to an adhesive-layer surface of the adhesive sheet. This was achieved by means of a bonder under conditions in which the attained temperature was 210° C. and the pressure-bonding time was 10 seconds. Then, the insulation resistance between the bumps was measured and the rate of occurrence of a short circuit was calculated. The measurement results are shown in Table 1.

TABLE 1

| Solvent | Evaluation items | Comparative Example 1 | Example 1 | Example 2 | Example 3 | Example 4 |
|---|---|---|---|---|---|---|
| Toluene | Ratio of dissolved portion (wt %) | 26.9 | 7.5 | 3.8 | 4.0 | 8.3 |
|  | Withstand voltage (kV) | 0.4 | 2.0 | 2.4 | 2.3 | 1.8 |
| MEK | Ratio of dissolved portion (wt %) | 27.4 | 8.2 | 4.4 | 6.1 | 8.7 |
|  | Withstand voltage (kV) | 0.5 | 1.9 | 2.2 | 2.0 | 1.5 |
| Ethyl acetate | Ratio of dissolved portion (wt %) | 26.6 | 7.2 | 4.0 | 5.8 | 7.9 |
|  | Withstand voltage (kV) | 0.6 | 2.1 | 2.6 | 2.1 | 1.6 |
| Rate of occurrence of short circuit (%) |  | 6.2 | 0.3 | 0.0 | 0.0 | 0.5 |

As is apparent from Table 1, the insulation coated conductive particles of Examples 1 to 4 are better in terms of both a solvent resistance and a withstand voltage property for all of the above solvents, as compared with the insulation coated conductive particles of Comparative Example 1 that were not surface-treated with an aziridine compound. Therefore, the conduction reliability is also improved. Moreover, the rate of occurrence of a short circuit is very small and the favorable storage stability is expected.

INDUSTRIAL APPLICABILITY

The insulation coated conductive particles of the present invention have excellent a solvent resistance, an excellent withstand voltage property, and improved conduction reliability. Moreover, the rate of occurrence of a short circuit is very small and it is therefore expected that storage stability of the insulation coated conductive particle of the present invention is favorable. Accordingly, the insulation coated conductive particles of the present invention are useful as conductive particles in the manufacture of anisotropic conductive adhesives.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. An insulation coated conductive particle comprising a conductive particle having a surface that is coated with an insulating resin layer formed of an insulating resin having a carboxyl group, wherein the insulating resin layer is surface-treated with a polyfunctional aziridine compound, wherein an amount of the carboxyl group in the insulating resin is in a range of from about 0.1 to about 50 mg KOH/g.

2. The insulation coated conductive particle according to claim 1, wherein the insulating resin layer is composed of an insulating resin selected from the group consisting of an acrylic acid monomer unit and a methacrylic acid monomer unit.

3. The insulation coated conductive particle according to claim 1, wherein the polyfunctional aziridine compound is trimethylolpropane-tri-β-aziridinylpropionate, tetramethylolmethane-tri-β-aziridinylpropionate, or N,N-hexamethylene-1,6-bis-1-aziridinecarboxamide.

4. The insulation coated conductive particle according to claim 3, wherein the insulating resin layer is composed of an insulating resin selected from the group consisting of an acrylic acid monomer unit and a methacrylic acid monomer unit.

5. The insulation coated conductive particle according to claim 4, wherein the insulating resin is an acrylic acid-styrene copolymer.

6. The insulation coated conductive particle according to claim 1, wherein the polyfunctional aziridine compound has two or more aziridine groups.

7. The insulation coated conductive particle according to claim 1, wherein a thickness of the insulating resin layer is in the range from about 0.01 to 1 μm.

8. The insulation coated conductive particle according to claim 1, wherein the resin layer has carboxyl groups that react with the polyfunctional aziridine during the surface treatment.

9. An anisotropic conductive adhesive comprising an insulation coated conductive particle that is dispersed in an insulating adhesive, wherein the insulation coated conductive particle includes a conductive particle having a surface that is coated with an insulating resin layer formed of an insulating resin having a carboxyl group, and wherein the insulating resin layer is surface-treated with a polyfunctional aziridine compound, wherein an amount of the carboxyl group in the insulating resin is in a range of from about 0.1 to about 50 mg KOH/g.

10. The anisotropic conductive adhesive according to claim 9, wherein the insulating resin layer is composed of an insulating resin selected from the group consisting of an acrylic acid monomer unit and a methacrylic acid monomer unit.

11. The anisotropic conductive adhesive according to claim 9, wherein the polyfunctional aziridine compound is trimethylolpropane-tri-β-aziridinylpropionate, tetramethylolmethane-tri-β-aziridinylpropionate, or N,N-hexamethylene -1,6-bis-1-aziridinecarboxamide.

12. The anisotropic conductive adhesive according to claim 11, wherein the insulating resin layer is composed of an insulating resin selected from the group consisting of an acrylic acid monomer unit and a methacrylic acid monomer unit.

13. The anisotropic conductive adhesive according to claim 12, wherein the insulating resin is an acrylic acid-styrene copolymer.

14. The anisotropic conductive adhesive according to claim 9, wherein the insulating adhesive contains an epoxy resin.

15. The anisotropic conductive adhesive according to claim 9, wherein the polyfunctional aziridine compound has two or more aziridine groups.

16. The anisotropic conductive adhesive according to claim 9, wherein a thickness of the insulating resin layer is in the range from about 0.01 to 1 μm.

17. The anisotropic conductive adhesive according to claim 9, wherein the resin layer has carboxyl groups that react with the polyfunctional aziridine during the surface treatment.

18. The anisotropic conductive adhesive according to claim 9, wherein an amount of the insulation coated conductive particles is in the range of from 1 vol % to 20 vol %.

* * * * *